United States Patent
Chen et al.

(10) Patent No.: US 9,615,466 B2
(45) Date of Patent: Apr. 4, 2017

(54) TOOL LESS COMPONENT CARRIER

(71) Applicant: Quanta Computer Inc., Taoyuan (TW)

(72) Inventors: Chao-Jung Chen, Taoyuan (TW); Yaw-Tzorng Tsorng, Taoyuan (TW); Chun Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 14/963,902

(22) Filed: Dec. 9, 2015

(65) Prior Publication Data

US 2017/0034927 A1 Feb. 2, 2017

Related U.S. Application Data

(60) Provisional application No. 62/198,717, filed on Jul. 30, 2015.

(51) Int. Cl.
*H05K 5/00* (2006.01)
*G11B 33/02* (2006.01)

(52) U.S. Cl.
CPC ......... *H05K 5/0013* (2013.01); *G11B 33/022* (2013.01); *H05K 5/0052* (2013.01)

(58) Field of Classification Search
None
See application file for complete search history.

(56) References Cited

U.S. PATENT DOCUMENTS

| | | | | |
|---|---|---|---|---|
| 5,423,605 A * | 6/1995 | Liu | ...... | H05K 5/0013 312/111 |
| 6,606,256 B1 * | 8/2003 | Lee | ...... | G06F 1/184 361/679.33 |
| 6,636,422 B1 * | 10/2003 | Tanzer | ...... | G11B 33/022 312/332.1 |
| 6,788,531 B2 * | 9/2004 | Chen | ...... | H05K 7/14 211/26 |
| 7,016,190 B1 * | 3/2006 | Chang | ...... | G06F 1/184 235/381 |
| 7,729,110 B2 * | 6/2010 | Zhang | ...... | G11B 33/12 248/633 |
| 8,254,106 B2 * | 8/2012 | Lin | ...... | G06F 1/187 312/223.1 |
| 2005/0038926 A1 * | 2/2005 | Chang | ...... | G06F 1/184 710/8 |
| 2005/0135000 A1 * | 6/2005 | Kao | ...... | G06F 1/184 360/99.13 |

(Continued)

*Primary Examiner* — Xanthia C Cunningham
(74) *Attorney, Agent, or Firm* — Nixon Peabody LLP

(57) ABSTRACT

A component carrier includes a housing having an open front portion, two partially open sidewalls, and a partial rear wall forming a receiving space. The receiving space is configured to receive at least one storage device. A flange extending from the housing is configured to receive a first insertable connector. The first insertable connector is configured to engage an electronic device, thereby securing the carrier assembly to the electronic device. A front panel is configured to be coupled with the housing by a second insertable connector, thereby enclosing the receiving space. The second insertable connector configured to engage one partially open sidewall. The first insertable connector and the second insertable connector are individually transitionable between a secured configuration and an unsecured configuration without tools.

19 Claims, 6 Drawing Sheets

(56) References Cited

U.S. PATENT DOCUMENTS

| | | | |
|---|---|---|---|
| 2005/0229198 A1* | 10/2005 | Christie | G11B 17/041 |
| | | | 720/730 |
| 2010/0079936 A1* | 4/2010 | Bridges | G11B 33/126 |
| | | | 361/679.02 |
| 2011/0234064 A1* | 9/2011 | Makley | G06F 1/187 |
| | | | 312/236 |
| 2013/0222992 A1* | 8/2013 | Wilke | H05K 3/22 |
| | | | 361/679.4 |
| 2016/0260462 A1* | 9/2016 | Szczesniak | G11B 33/022 |

* cited by examiner

TOOL LESS COMPONENT CARRIER

CROSS REFERENCE TO RELATED APPLICATIONS

This instant application claims priority to U.S. Provisional Application No. 62/198,717, filed on Jul. 30, 2015, entitled "Tool-less HDD Carrier", the contents of which are incorporated by reference herein in its entirety.

FIELD

The subject matter herein generally relates to a storage device carrier. More specifically, the subject matter herein relates to a storage device carrier configured to be secured in and removed from an electronic device without the use of tools.

BACKGROUND

Electronic devices implement component carriers within an electronic device housing to secure one or more components. The component carriers are often secured within the electronic device housing using screws requiring a technician to use tools to remove the component carrier. The one or more components often require maintenance and/or replacement throughout the life of the electronic device, thus the component carrier must be removed by a technician with proper tools. The requirement of tools increases the down time and associated maintenance costs with repairing and replacing components within electronic devices.

BRIEF DESCRIPTION OF THE DRAWINGS

Implementations of the present technology will now be described, by way of example only, with reference to the attached figures, wherein.

DETAILED DESCRIPTION

Figure 1:
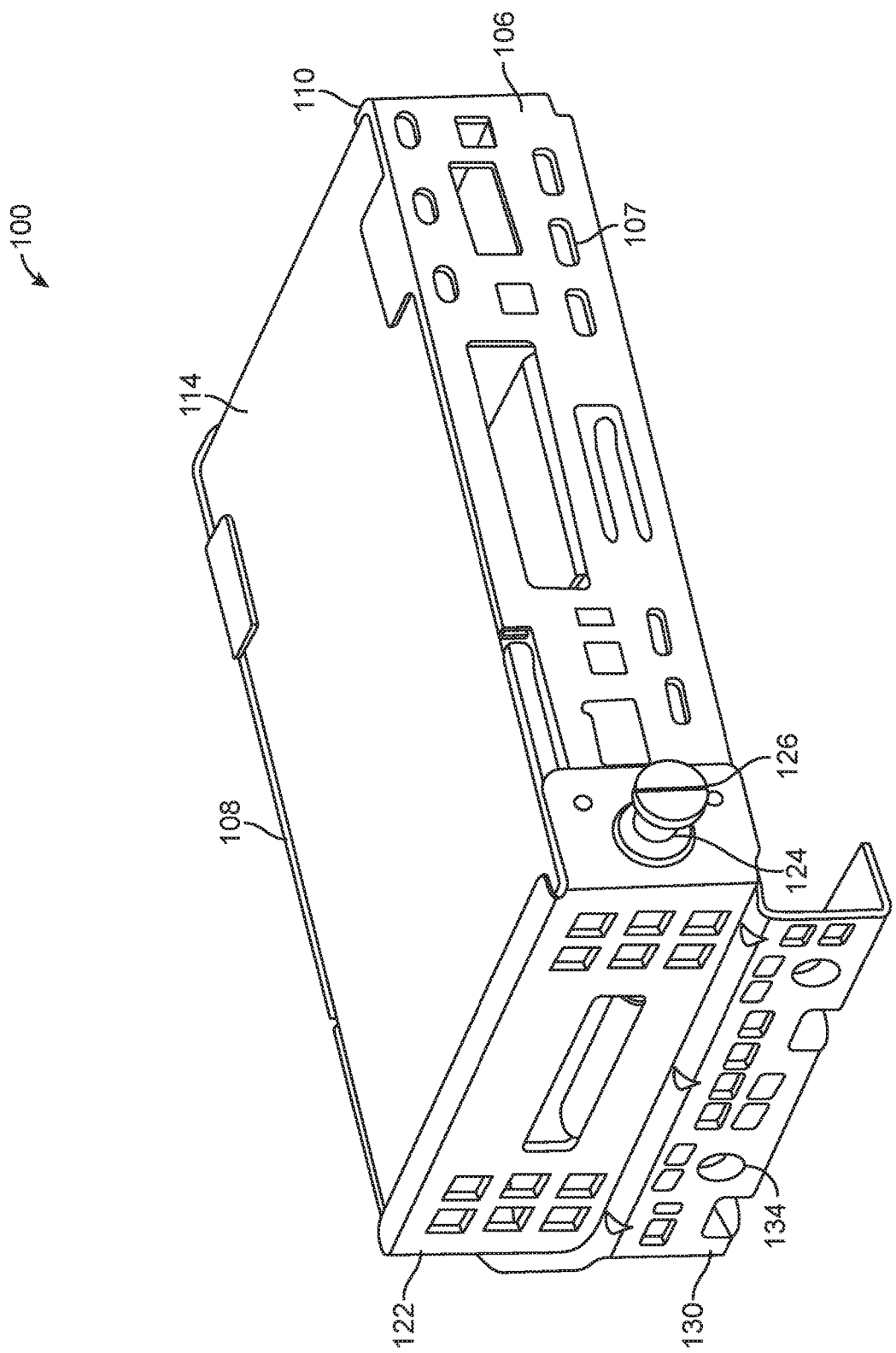
FIG. 1 is an isometric view of an example embodiment of a component carrier in accordance with the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented. The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

Embodiments of the present disclosure relate to a component carrier capable of implementing one or more components. The present disclosure refers to, interchangeably, a component carrier, carrier assembly, a hard disk drive (HDD) carrier, or a carrier device. The component carrier is configured to receive one or more components therein, and be received in an electronic device. The electronic device can be a computer, server, blade server, rack server, or other similar electronic device.

Embodiments of the present disclosure are focused on a component carrier capable of receiving one or more storage devices. A component carrier includes a housing having an open front portion, two partially open sidewalls, and a partial rear wall forming a receiving space. The receiving space is configured to receive at least one storage device. A flange extending from the housing is configured to receive a first insertable connector. The first insertable connector is configured to engage an electronic device, thereby securing the carrier assembly to the electronic device. A front panel is configured to be coupled with the housing by a second insertable connector, thereby enclosing the receiving space. The second insertable connector is configured to engage one partially open sidewall. The first insertable connector and the second insertable connector are individually insertable and removable between a secured configuration and an unsecured configuration without tools.

While the illustrated embodiments are specifically drawn to a component carrier configured to receive HDDs, it is within the scope of this disclosure to implement the component carrier with other components including, but not limited to, solid state drives (SSDs). Further, while two components are shown received within the component carrier, more or less components can be implemented within the component carrier without altering the scope of this disclosure.

Further, while the illustrated embodiments are specifically drawn to a component carrier with insertable connectors having a threadable engagement, it is within the scope of this disclosure to implement the component carrier with other insertable connectors including, but not limited to, screws, bolts, and slotted pins.

Figure 2:
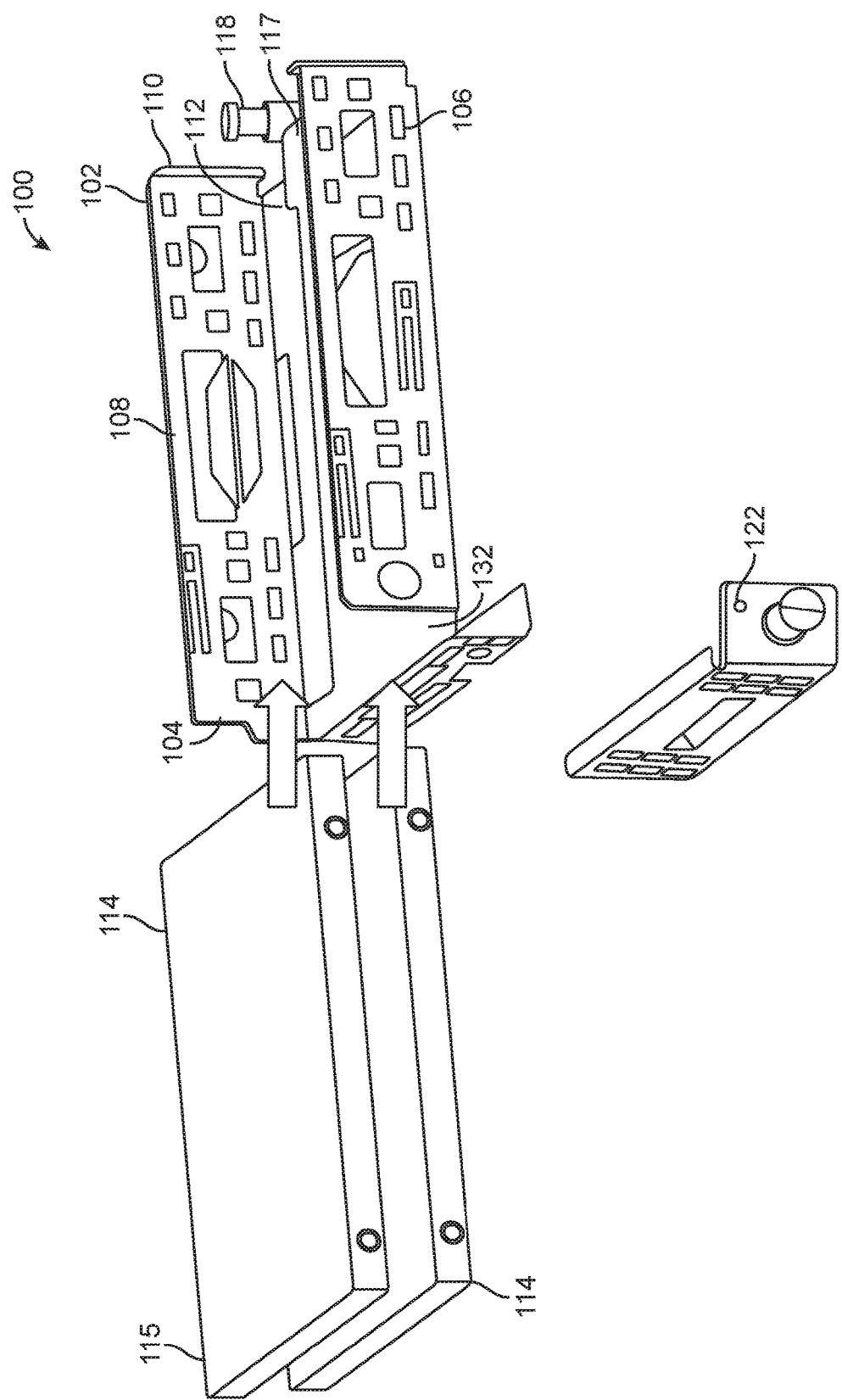
FIG. 2 is an exploded view of an example embodiment of a component carrier in accordance with the present disclosure.
Figure 3:
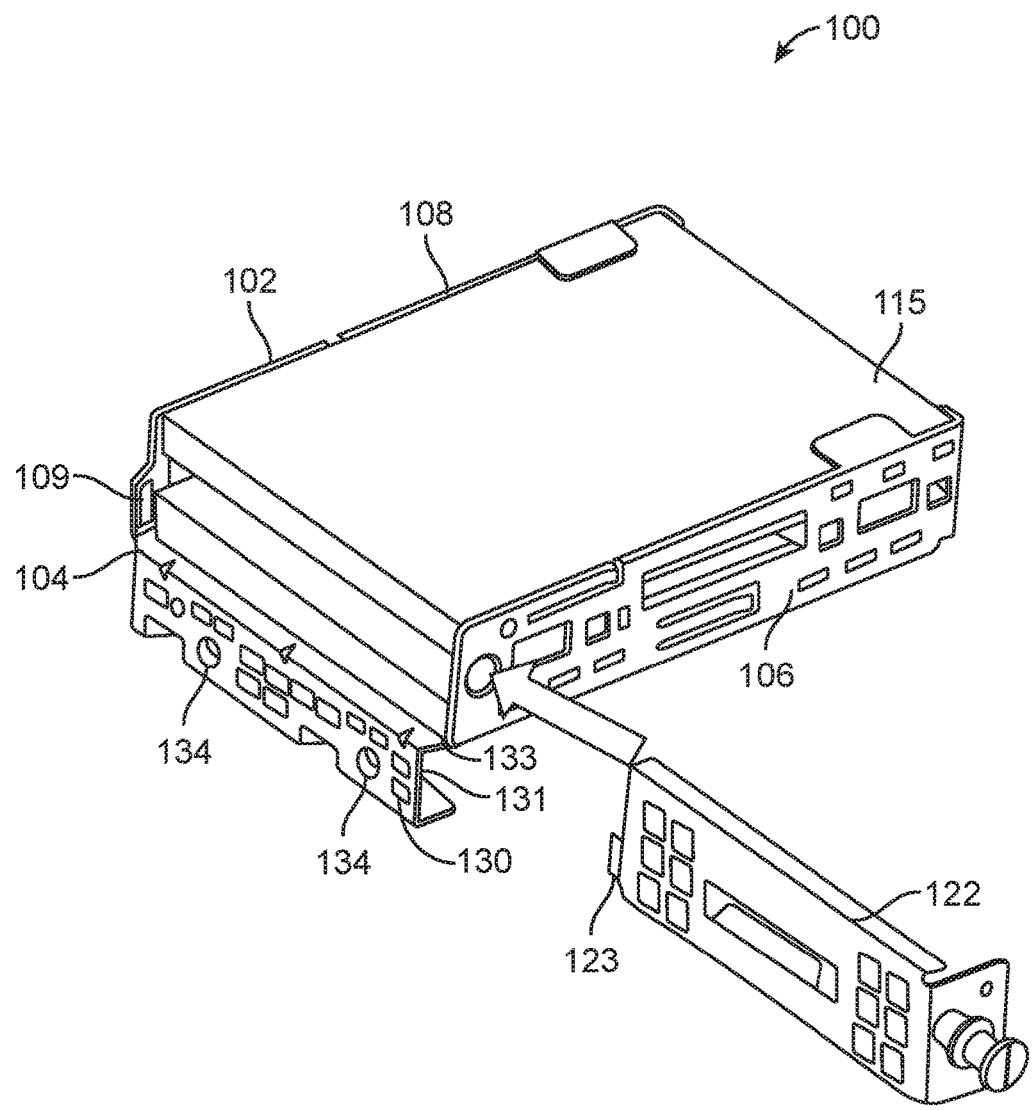
FIG. 3 is a partially assembled view of an example embodiment of a component carrier in accordance with the present disclosure.

FIGS. 1-3 illustrate an example embodiment of a component carrier 100 in accordance with the present disclosure. Component carrier 100 has a housing 102 with an open front portion 104, two partially open sidewalls 106, 108 and a partial rear wall 110 (shown in FIG. 2) defining a receiving space 112. The component carrier 100 also includes a front panel portion 122 configured to secure to the housing 102 and cover the front portion 104.

The receiving space 112 is configured to receive at least one storage device 114. The storage device 114 can be a Hard Disk Drive (HDD), Solid State Drive (SSD), or any other known storage media. In at least one embodiment, the at least one storage device is two 2.5" HDDs. In other embodiments, the at least one storage device 114 can be a 3.5" HDD, 3.5" SDD, or a combination thereof. However, the present disclosure is not limited to any particular type of storage device.

The partially open sidewalls 106, 108 provide structure and rigidity to the housing 102 while also allowing air flow into, through, and around the housing 102. The partial openness of each sidewall 106, 108 improves airflow and associated cooling within the housing 102. The partially open sidewalls 106, 108 each have a plurality of ports 107 of various shapes and sizes formed therein. The plurality of ports 107 also reduce the required material for the housing 102, thus reducing the weight of the component carrier 100.

FIG. 2 illustrates an exploded view of an example embodiment of a component carrier 100. The partial rear wall 110 is formed by flanges extending from each sidewall 106, 108. The partial rear wall 110 provides access for electrical coupling of the at least one storage device 114 to an electronic device 200 (shown in FIGS. 5-6). In other embodiments, the partial rear wall 110 can partially extend from the sidewalls 106, 108, a top surface, a bottom surface 132, any other combination thereof. In yet other embodiments, the rear wall 110 can be a complete wall having a plurality of ports similar to the partially open sidewalls 106, 108.

The housing 102 has a flange 117 with a hole adjacent to the rear wall 110, which can receive a connector 118. As discussed in more detail below, the first insertable connector 118 can engages with the electronic device to securely couple the component carrier 100 with the electronic device 200. The first insertable connector 118 is insertable and removable from the corresponding receiving member 202, thereby securing and releasing the component carrier 100 from the electronic device 200.

As can be appreciated in FIG. 2, two storage devices 114 are slidingly received into the receiving space 112 through the front portion 104. The housing 102 includes an open top surface, and the partial sidewalls 106, 108 each have a flange to secure the top portion of the uppermost storage device 115.

FIG. 3 illustrates a partially assembled view of an example embodiment of a component carrier having at least one storage device 114 received therein. The housing 102 has at least one flange 130 extending away from a bottom surface 132 to elevate the housing 102 above a bottom surface of the electronic device 200 when the component carrier is secured within the electronic device 200 (shown in FIG. 6). The flange 130 includes at least one guide pin hole 134 to engage at least one corresponding guide pin 204 on the electronic device 200 (shown in FIG. 5). The at least one guide pin hole 134 and the corresponding guide pin 204 can assist alignment during coupling of the component carrier 100 with the electronic device 200. The at least one guide pin 134 and the corresponding guide pin 204 can also assist in further securing the component carrier 100 with the electronic device 200 in conjunction with the first insertable connector 118 (shown in FIG. 2). In other embodiments, the component carrier 100 can have at least one guide pin configured to engage with at least one corresponding guide pin hole on the electronic device.

The flange 130 is coupled with and extends from the bottom surface 132 of the housing 102. A ridge 131 is formed at the bottom surface 132 adjacent to the front portion 104. The ridge 131 is the front edge of the receiving space 112 and slopes toward the receiving space 112 to define groove 133 configured to slidingly receive the front panel 122.

The front panel 122 of the housing 102 is slidingly couplable with the housing 102 and to selectively cover and open the front portion 104. The front panel 122 coupling with the housing 102 encloses the receiving space 112 and secures the at least one storage device 114. The front panel 122 is couplable with one of the sidewalls 106, 108 by a second insertable connector 124.

The second insertable connector 124 threadably engages with the one of sidewalls 106, 108 to secure the front panel 122 to the housing 102 and enclose the receiving space 112. The second insertable connector 124 preferably has a head 126 having a diameter at least three times the diameter of the body of the second insertable connector 124, thus allowing tool-less operation of the second insertable connector 124. The head 126 also includes a textured outer perimeter configured to increase grip and allow a user to hand operate the second insertable connector 124. The textured outer perimeter can be a plurality of ridges, plurality of grooves, or knurling. In at least one embodiment, the second insertable connector 124 also includes grooves in the top first of the head 126 to receive a cross-point (also known Phillips head) screw driver and/or a flat head screw driver should a user prefer to use a tool. In other embodiments, the second insertable connector 124 can be a pin configured to pressure fit engage with a corresponding member of the electronic device 200, a threaded bolt, or any other tool-less engagement mechanism.

As can be appreciated in FIG. 3, the front panel 122 slides laterally across the housing 102 to cover the front portion 104. The front panel 122 has a protrusion 123 receivable in a corresponding slot 109 on the partially open sidewall 108 to engage the front panel 122 with the housing 102. The second insertable connector 124 then engages with the opposing sidewall 106 to secure the front panel 122 with the housing 102.

In at least one embodiment, the front panel 122 can slide vertically into the housing 102 to cover the front portion and include a protrusion extending from a bottom surface of the front panel 122 and received into the bottom surface 132 of the housing 102.

Figure 4:
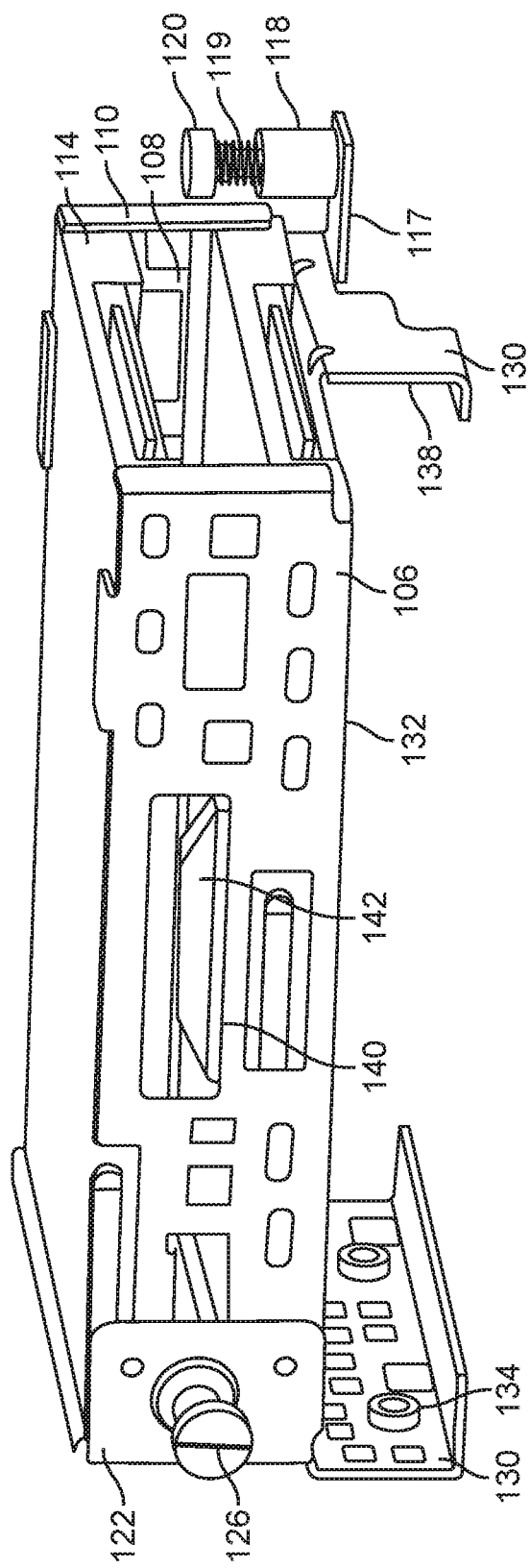
FIG. 4 is an elevational view of an example embodiment of a component carrier in accordance with the present disclosure.

FIG. 4 illustrates an elevational side view of an example embodiment of a component carrier having the front panel coupled with the housing. The component carrier 100 can be releasably coupled with the electronic device 200 (shown in FIGS. 5-6) by the first insertable connector 118. The first insertable connector 118 threadingly engages with a corresponding receiving member 202 of the electronic device 200 (shown in FIG. 6). The first insertable connector 118 has a head 120 having a diameter at least three times the diameter of the body of the first insertable connector 118, thus allowing tool-less operation of the first insertable connector 118. The head 120 also includes a textured outer perimeter configured to increase grip and allow a user to hand operate the first insertable connector 118. The textured outer perimeter can be a plurality of ridges, plurality of grooves, or knurling. In at least one embodiment, the first insertable connector 118 also includes grooves in the top first of the head 120 to receive a cross-point (also known Phillips head) screw driver and/or a flat head screw driver should a user prefer to use a tool. In other embodiments, the first insertable connector 118 can be a pin configured to pressure fit engage with a corresponding member of the electronic device 200, a threaded bolt, or any other tool-less engagement mechanism.

In other embodiments, the first insertable connector 118 can have one or more protrusions outwardly extending and receivable within the corresponding receiving portion 204 such that as the first insertable connector 118 is rotated to a secured position, the protrusions engage the sidewall of the corresponding receiving portion 204 to secure the component carrier 100.

In an unsecured configuration, the first insertable connector 118 is substantially level with the bottom surface 132 of the housing 102 and does not extend blow the bottom surface 132. The first insertable connector 118 can have a biasing element 119 to further assist the transition from a secured to an unsecured position. The biasing element 119 can be a spring configured to retain the first insertable connector 118 in the unsecured configuration when not in use. In a secured configuration, the first insertable connector 118 extends below the bottom surface 132 of the housing 102 and is received in the corresponding receiving member 202, thereby coupling the component carrier 100 with the electronic device 200.

A rear support 135 supports and elevates the partial rear wall 110 above the electronic device 200. The rear support 135 is substantially the same height as the at least one flange 130. The at least one flange 130 and rear support 135 elevate the housing 102 above the electronic device 200 to provide a cable management space 138 to receive power and communication cabling between the electronic device 200, the component carrier 100, and other components within the electronic device 200.

The partially open sidewalls 106, 108 can have support fins 140 extending inwardly into the receiving space 112 to secure the at least one storage device 114. In the embodiment of FIG. 4, the component carrier 100 has two storage devices 114 received within the receiving space 112 of the housing. A longitudinally extending support fin 140 extends from each sidewall 106, 108 into the receiving space 112 and supports an uppermost storage device 115. A spacer 142 separates the two storage devices 114, one from the other. The spacer 142 allows better airflow between the two storage devices 114, thus improving the cooling of the storage devices 114.

Figure 5:
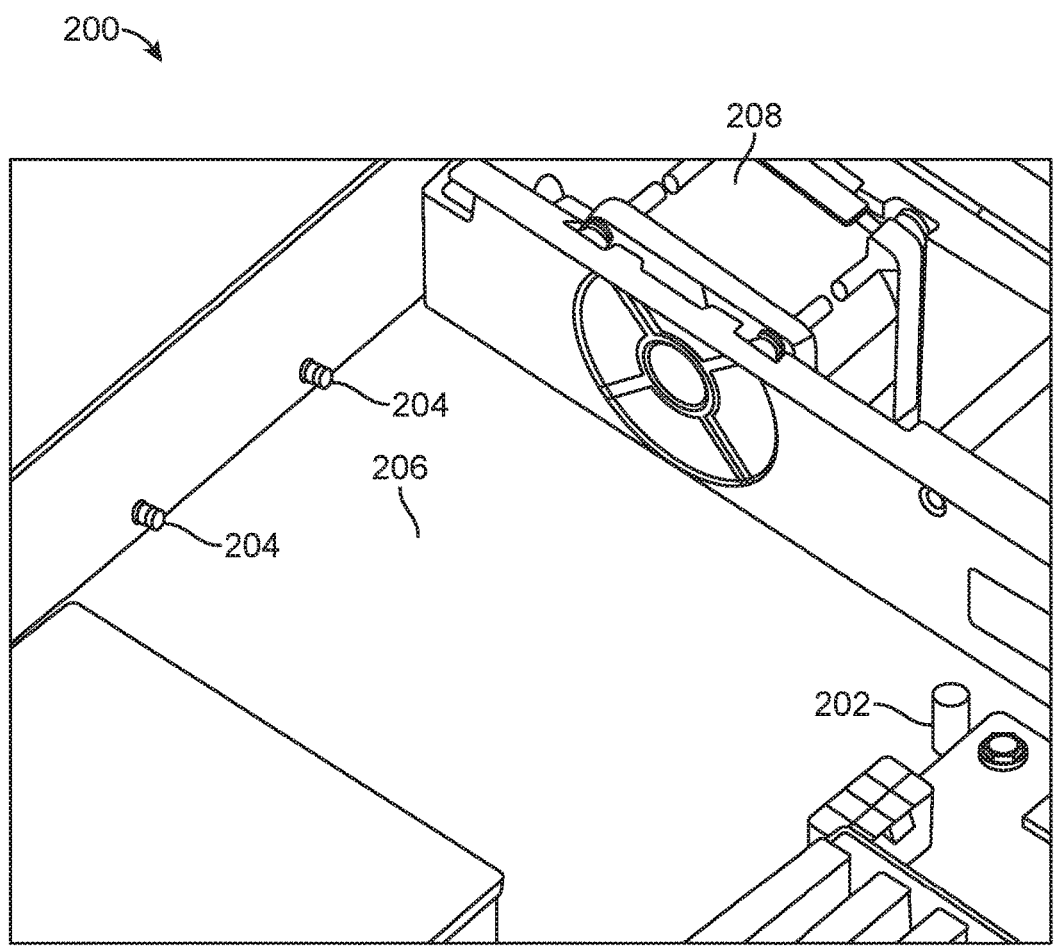
FIG. 5 is an isometric view of an example embodiment of an electronic device capable of receiving a component carrier.

FIG. 5 illustrates an example embodiment of an electronic device 200 having a receiving space 206 configured to receive the component carrier 100 (shown in FIGS. 1-4). The electronic device has a receiving space 206 configured to receive the component carrier 100 within the electronic device 200. The electronic device 200 has a receiving member 202 configured to receive the first insertable connector 118. The receiving member 202 is raised to accommodate the at least one flange 130 and the rear support 135 and allow the receiving member 202 to receive a first insertable connector 118. The electronic device 200 also includes two guide pins 204 configured to be received in two corresponding guide pin holes 134 on the component carrier 100 (shown in FIGS. 3-4).

Figure 6:
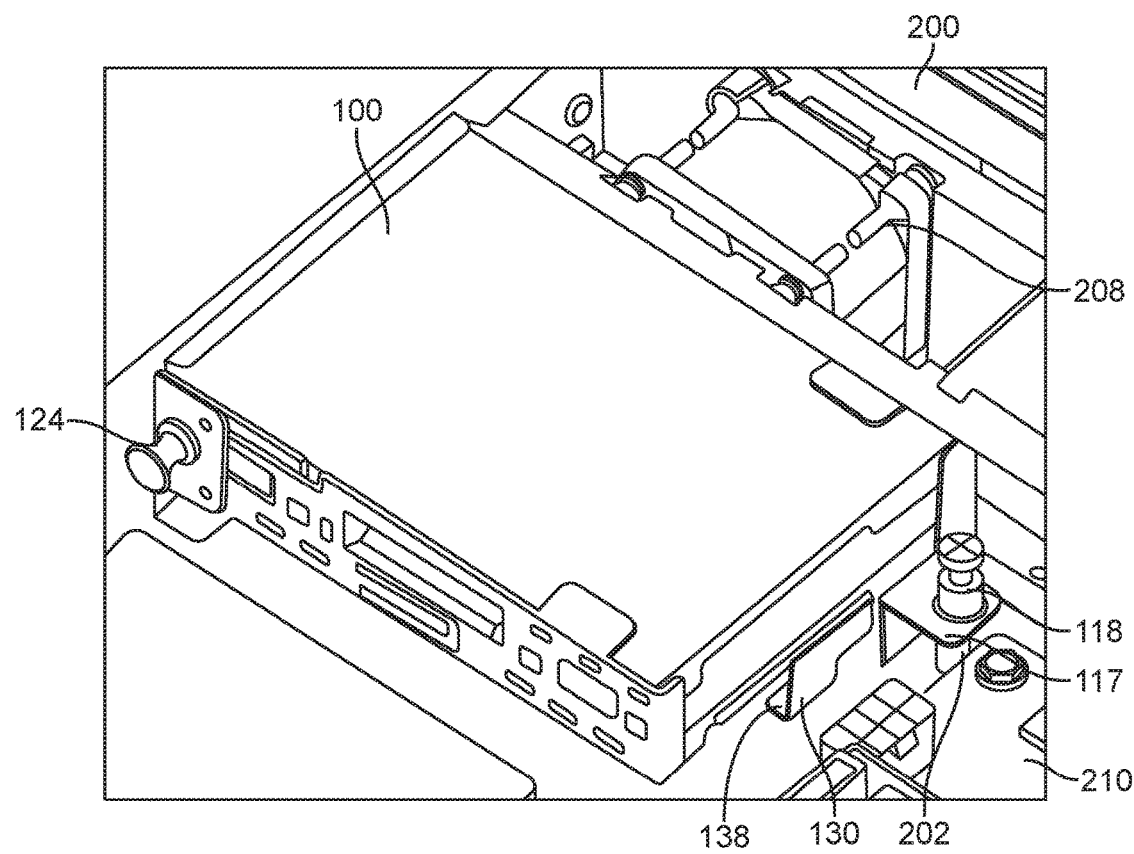
FIG. 6 is an isometric view of an example embodiment of an electronic device having a component carrier received therein.

FIG. 6 illustrates an example embodiment of an electronic device having a component carrier received therein. The electronic device 200 can receive the component carrier 100 into the receiving space 206. The component carrier 100 couples to the electronic device 200 with the first insertable connector 118. The electronic device 200 can also include a fan 208 to induce an airflow and cool the component carrier 100 and a printed circuit board 210 to electronically couple the at least one storage device 114 with the electronic device 200. The printed circuit board 210 can have a processor, non-volatile storage media, a power source, and other components disposed thereon. As can be appreciated in FIG. 6, the at least one flange 130 and the rear support 135 of the component carrier 100 provide elevation above the bottom surface of the electronic device 200, thus allowing the cable management space 138 for power and communicative cabling.

It is believed the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiments of the disclosure.

What is claimed is:

1. A component carrier comprising:
   a housing having an at least partially open front portion, two partially open sidewalls, and a partial rear wall forming a receiving space configured to receive at least one storage device;
   a flange extending from the housing configured to receive first insertable connector, the first insertable connector configured to engage an electronic device external to the housing;
   a front panel configured to slideably and laterally coupled with the housing to cover the front portion, the front panel having a side portion perpendicular to the front panel; and
   a second insertable connector configured to releasably engage the side portion and one of the sidewalls to thereby secure the font panel over the front portion;
   wherein the first insertable connector and the second insertable connector are configured to be inserted and removed without tools.

2. The component carrier of claim 1, wherein housing lacks a top surface.

3. The component carrier of claim 1, wherein each of the first insertable connector and the second insertable connector have a head having a perimeter with roughen outer edges allowing transitioning between a secured configuration and an unsecured configuration by thumb operation.

4. The component carrier of claim 1, wherein the housing includes at least one flange extending away from a bottom surface of the receiving space to elevate the housing above the electronic device.

5. The component carrier of claim 4, wherein the at least one flange has one or more guide pin holes to engage corresponding guide pins on the electronic device.

6. The component carrier of claim 1, wherein the first insertable connector extends from the bottom surface and secures the housing to the electronic device.

7. The component carrier of claim 4, the elevation of the bracket defines a cable management space to secure and direct cabling within the electrical device.

8. The component carrier of claim 1, wherein the each of the opposing sidewalls has an inwardly extending support fin configured to support an uppermost storage device.

9. The component carrier of claim 1, wherein an inwardly extending support fin provides a separating space between a first storage device and a second storage.

10. The component carrier of claim 1, wherein first insertable connector has a biasing element to assist transitioning between the secured configuration and the unsecured.

11. An electronic device comprising:
an electronic device housing configured to receive a component carrier therein;
the component carrier comprising:
a carrier housing having an at least partially open front portion, two partially open sidewalls, and a partial rear wall forming a receiving space configured to receive at least one storage device;
a flange extending from the carrier housing configured to receive first insertable connector, the first insertable connector configured to engage the electronic device housing;
a front panel configured to slideably and laterally couple with the carrier housing to cover the front portion, the front panel having a side portion perpendicular to the front panel; and
a second insertable connector configured to releasably engage the side portion and one of the sidewalls to enclose the receiving space and thereby secure the front panel over the front portion;
wherein the first insertable connector and the second insertable connector are configured to be inserted and removed without tools; and
a printed circuit board configured to electronically couple with the at least one storage device received in the carrier housing.

12. The electronic device of claim 11, wherein each of the first insertable connector and the second insertable connector have a head having a perimeter with roughen outer edges allowing operation between a secured configuration and an unsecured configuration by a user's thumb.

13. The electronic device of claim 11, wherein the carrier housing includes at least one flange extending away from a bottom surface of the receiving space and elevates the carrier housing above a bottom surface of the electronic device housing.

14. The electronic device of claim 13, wherein the electronic device housing has at least one inwardly extending guide pins configured to engage a corresponding guide pin hole on the component carrier.

15. The electronic device of claim 11, wherein electronic device housing has a receiving member configured to couple with the first insertable connector, the first insertable connector extending from the bottom surface of the carrier assembly.

16. The electronic device of claim 13, the elevation of the carrier housing defines a cable management space for securing and directing cabling between the carrier housing and the electrical device housing.

17. The electronic device of claim 11, wherein the each of the opposing sidewalls of the carrier housing has an inwardly extending support fin configured to support an uppermost storage device of the at least one storage device.

18. The electronic device of claim 11, wherein an inwardly extending support fin provides a separating space between a first storage device and a second storage device.

19. The electronic device of claim 11, wherein first insertable connector has a biasing element to assist transitioning between the secured configuration and the unsecured configuration.

* * * * *